(12) United States Patent
Babcock et al.

(10) Patent No.: US 8,207,559 B2
(45) Date of Patent: Jun. 26, 2012

(54) SCHOTTKY JUNCTION-FIELD-EFFECT-TRANSISTOR (JFET) STRUCTURES AND METHODS OF FORMING JFET STRUCTURES

(75) Inventors: Jeffrey A. Babcock, Santa Clara, CA (US); Natalia Lavrovskaya, Synnyvale, CA (US); Saurabh Desai, Fremont, CA (US); Alexei Sadovnikov, San Jose, CA (US); Zia Alan Shafi, Boise, ID (US)

(73) Assignee: Texas Instruments Incorporated, Dallas, TX (US)

( * ) Notice: Subject to any disclaimer, the term of this patent is extended or adjusted under 35 U.S.C. 154(b) by 179 days.

(21) Appl. No.: 12/498,141

(22) Filed: Jul. 6, 2009

(65) Prior Publication Data

US 2010/0032731 A1   Feb. 11, 2010

Related U.S. Application Data

(60) Provisional application No. 61/134,822, filed on Jul. 14, 2008.

(51) Int. Cl.
*H01L 29/66* (2006.01)
(52) U.S. Cl. .................... 257/280; 257/E29.31
(58) Field of Classification Search .................. 257/224, 257/243, 240, 244, 280, 286, 349, 394, 484, 257/473, 476, 483, 287, E29.049, E29.052, 257/E29.26, E29.265, E29.31
See application file for complete search history.

(56) References Cited

U.S. PATENT DOCUMENTS

| | | | |
|---|---|---|---|
| 7,268,394 B2 | 9/2007 | Hao et al. | 257/341 |
| 2003/0197226 A1* | 10/2003 | Chen et al. | 257/355 |
| 2004/0207012 A1* | 10/2004 | Rumennik et al. | 257/343 |
| 2006/0113627 A1* | 6/2006 | Chen et al. | 257/500 |
| 2008/0092094 A1* | 4/2008 | Coolbaugh et al. | 716/4 |

* cited by examiner

*Primary Examiner* — Evan Pert
*Assistant Examiner* — Vongsavanh Sengdara
(74) *Attorney, Agent, or Firm* — Wade J. Brady, III; Frederick J. Telecky, Jr.

(57) ABSTRACT

In accordance with an aspect of the invention, A Schottky junction field effect transistor (JFET) is created using cobalt silicide, or other Schottky material, to form the gate contact of the JFET. The structural concepts can also be applied to a standard JFET that uses N– type or P– type dopants to form the gate of the JFET. In addition, the structures allow for an improved JFET linkup with buried linkup contacts allowing improved noise and reliability performance for both conventional diffusion (N– and P– channel) JFET structures and for Schottky JFET structures. In accordance with another aspect of the invention, the gate poly, as found in a standard CMOS or BiCMOS process flow, is used to perform the linkup between the source and the junction gate and/or between the drain and the junction gate of a junction filed effect transistor (JFET). Use of a bias on the gate linkup of the JFET allows an additional tuning knob for the JFET that can be optimized to trade off breakdown characteristics with reduced on resistance. In accordance with yet another aspect of the invention, a patterned buried layer is used to form the back gate control for a junction field effect transistor (JFET). The structure allows a layout or buried layer pattern change to adjust the pinch-off voltage of the JFET structure. Vertical and lateral diffusion of the buried layer is used to adjust the JFET operating parameters with a simple change in the buried layer patterns. In addition, the structures allow for increased breakdown voltage by leveraging charge sharing concepts and improving channel confinement for power JFET structures. These concepts can also be applied to both N– channel and P– channel diffusion JFETs and to Schottky JFET structures.

2 Claims, 13 Drawing Sheets

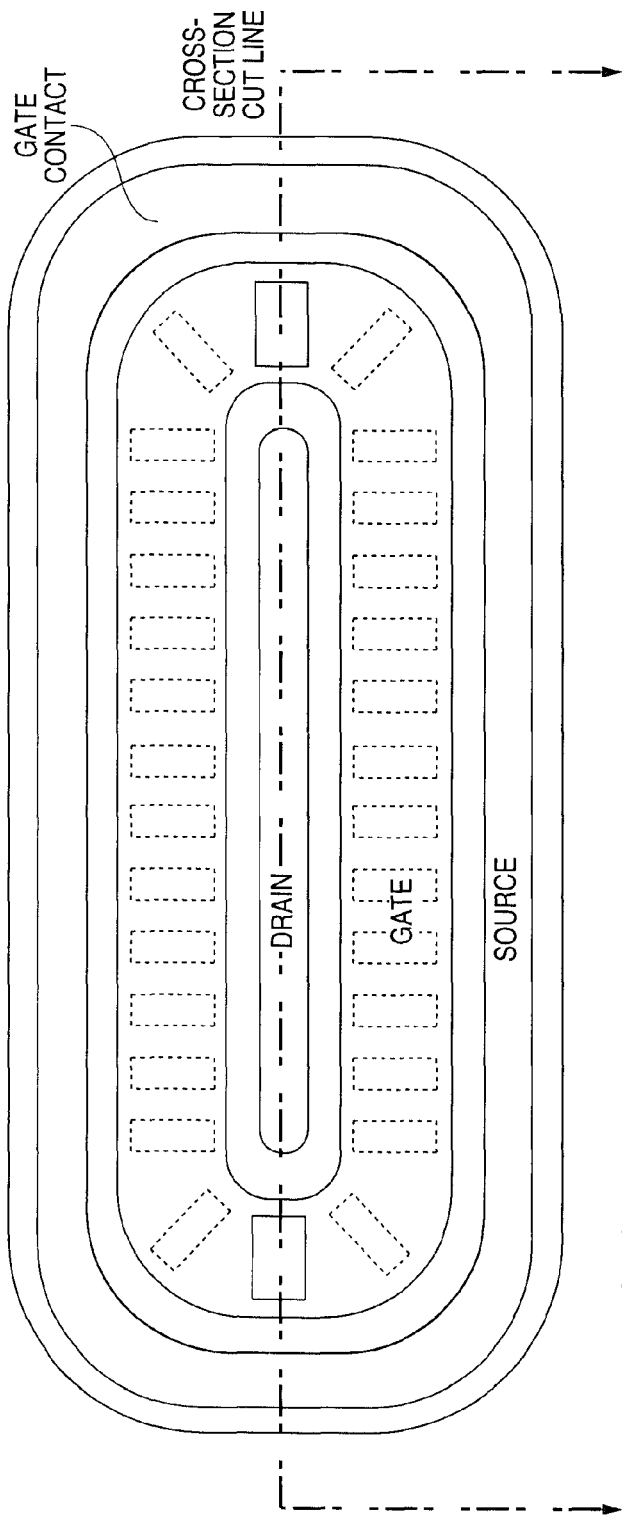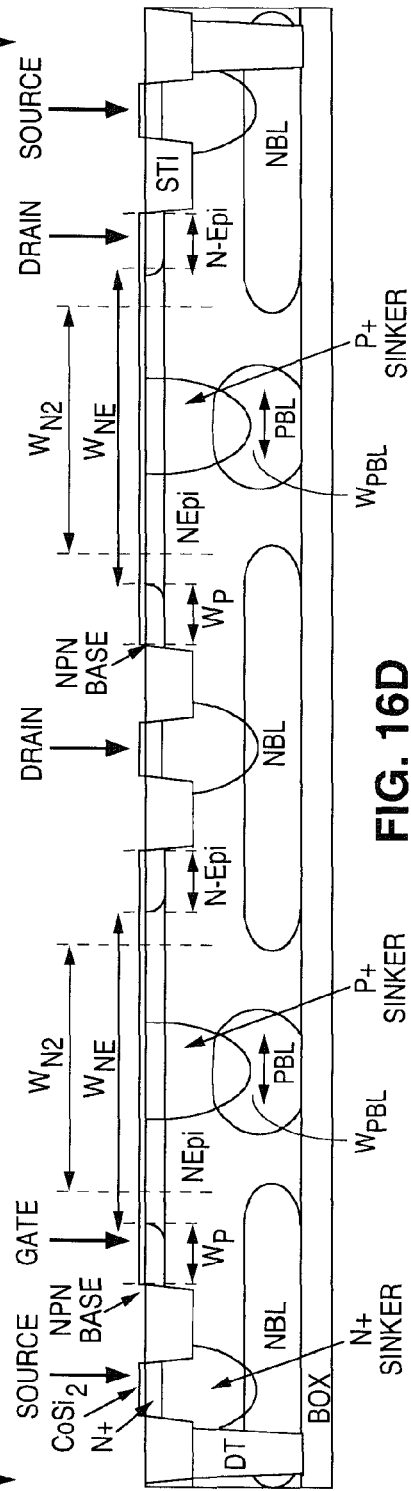
FIG. 16C
FIG. 16D

SCHOTTKY JUNCTION-FIELD-EFFECT-TRANSISTOR (JFET) STRUCTURES AND METHODS OF FORMING JFET STRUCTURES

PRIORITY CLAIM

This application claims the priority filing benefit of U.S. Provisional Patent Application No. 61/134,822, filed on Jul. 14, 2008, entitled "Method of Forming a Schottky JFET." U.S. Provisional Patent Application No. 61/134,822 is hereby incorporated by reference herein in its entirety.

FIELD OF THE INVENTION

The present invention relates to semiconductor integrated circuits and, in particular, to Schottky junction field effect transistor structures and methods of fabricating such structures.

SUMMARY OF THE INVENTION

In accordance with an aspect of the present invention, a Schottky junction field effect transistor (JFET) is created using cobalt silicide, or other Schottky material, to form the gate contact of the JFET in BiCMOS or CBiMOS processes. The proposed JFET structural architecture can also be applied to a standard JFET which uses N− type or P− type dopants to form the gate of the JFET. In addition, structures in accordance with this aspect of the invention allow for a unique improved JFET linkup, with buried linkup contacts allowing improved noise and reliability performance of the structure for both conventional diffusion (N− and P− channel) JFET structures and for Schottky JFET structures.

In accordance with another aspect of the present invention, the gate poly, as found in a standard CMOS or BiCMOS process flow, is used to perform the linkup between the source and the junction gate and/or between the drain and the junction gate of a junction field effect transistor (JFET). The JFET architecture with gate poly linkup offers an improved device with simplicity in manufacturing. Use of a bias on the gate linkup of a JFET allows an additional tuning knob for the JFET transistor that can be optimized to trade off breakdown characteristics with reduced on resistance of the structure.

In accordance with yet another aspect of the present invention, a patterned buried layer is used to form the back gate control for a junction field effect transistor (JFET). The structure allows a layout or buried layer pattern change to adjust the pinch-off voltage of the JFET structure. The structure is additionally useful for BiCMOS processes where buried layers are commonly used, or in BiCMOS process flows, and can be leveraged in JFET structure formation. Vertical and lateral diffusion of the buried layer is used to adjust the JFET operating parameters with a simple change in buried layer patterns. In addition, structures in accordance with this aspect of the invention allow for increased breakdown voltages by leveraging charge sharing concepts and improving channel confinement for the proposed power JFET structures. The concept can be applied to both N− channel and P− channel diffusion JFETs and to Schottky JFET structures.

The features and advantages of the various aspects of the present invention will be more fully understood and appreciated upon review and consideration of the following detailed description of the various aspects of the invention and the accompanying drawings which set forth illustrative embodiments of the invention.

BRIEF DESCRIPTION OF THE DRAWINGS

FIG. 16C is a top view layout drawing illustrating a power optimized n-channel JFET using a patterned P-buried layer for a back gate in accordance with another aspect of the present invention.

FIG. 16D is a schematic cross-section drawing illustrating the FIG. 16C power optimized n-channel JFET at the cut line shown in FIG. 16C.

DETAILED DESCRIPTION OF THE INVENTION

In accordance with an aspect of the present invention, cobalt silicide ($CoSi_2$), or other Schottky material, is utilized to form the gate of a Schottky-junction-field-effect-transistor (JFET). Due to the Schottky diode being a major carrier device, this structure provides faster switching speed compared to a standard junction isolated JFET.

Although the methodology for this aspect of the invention is described herein in the context of a CBiCMOS process flow, those skilled in the art will appreciate that the concept can be readily extended to other CMOS and advanced CMOS processes.

Figure 1:
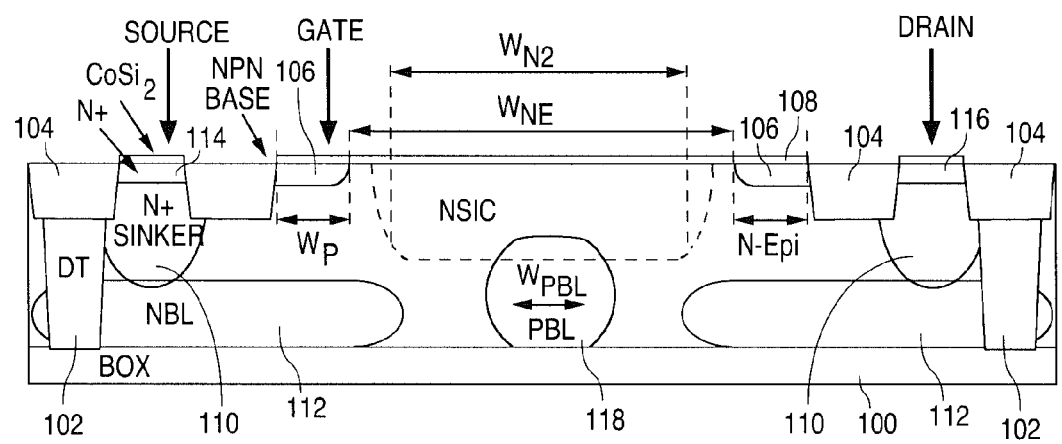
FIG. 1 is a schematic cross-section drawing illustrating an n-channel Schottky-JFET in accordance with an aspect of the present invention.

FIG. 1 shows a proposed architecture for creating a Schottky JFET in a standard CBiCMOS process fabricated on silicon on insulator (SOI) 100 with deep trench (DT) isolation 102 and shallow trench isolation 104. P+ guard rings 106 having width Wp are used on the outer edges of the Schottky gate 108 (width $W_{ne}$) and under the gate contacts to improve gate leakage of the Schottky JFET. An N+ sinker region 110 and the N+ buried layer (NBL) 112 provide link up from silicided (e.g., $CoSi_2$) source contact region 114 and the drain contact region 116 of the Schottky JFET. This allows a low resistance feed. Optimization between layout and diffusion properties of the NBL layer, as would be understood by those skilled in the art, will provide lowest source/drain resistance while maintaining desired breakdown capabilities, set by the N− epi drain and gate contact regions. The P− buried layer (PBL) 118 (width $W_{pbl}$) under the Schottky 108 gate is added to provide improved channel control and to act as a back gate channel blocking region.

Figure 2:
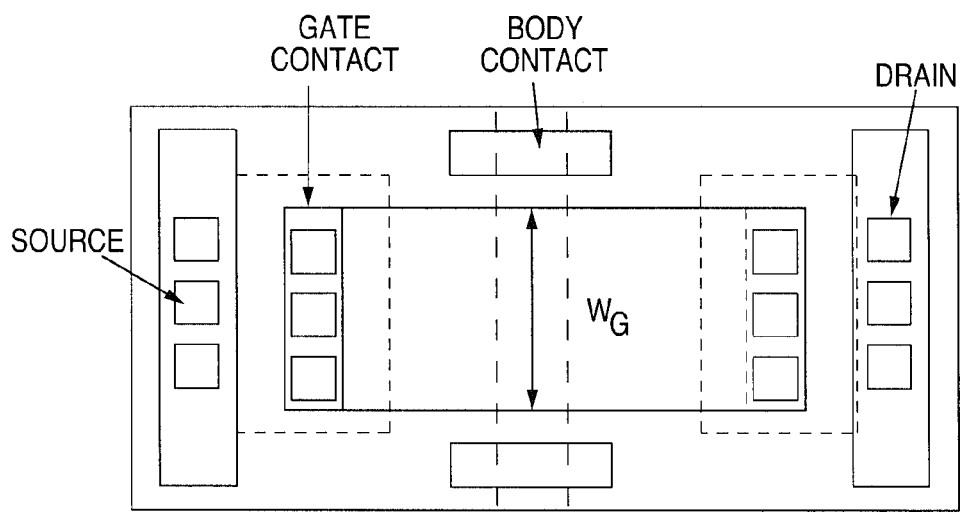
FIG. 2 is a top view layout drawing illustrating the FIG. 1 n-channel Schottky-JFET.

FIG. 2 shows the top view layout for the FIG. 1 structure. Optimization of layout dimensions and doping profiles can be done by those skilled in the art to achieve the best analog operating characteristics of a particular embodiment of the proposed Schottky JFET structure. Use of deep trench (DT) 102 and buried oxide (BOX) 100 allows the design of the Schottky cell to be minimized and provides full dielectric isolation of the proposed structure.

Figure 3A:
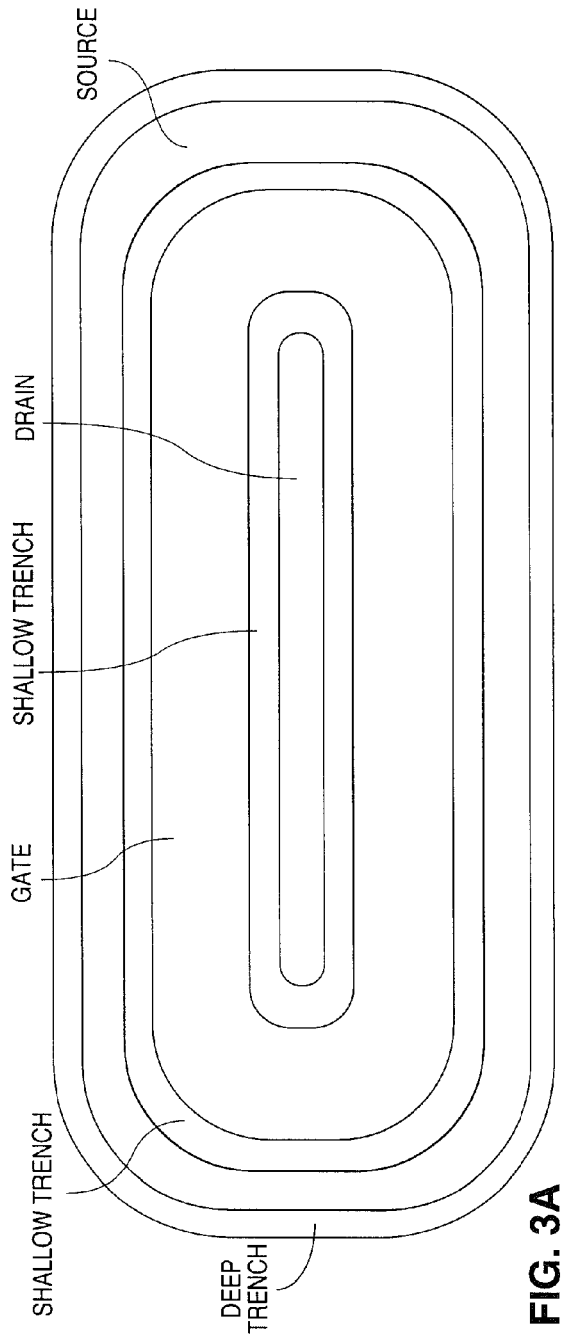
FIG. 3A is a top view layout drawing illustrating a power optimized Schottky-JFET in accordance with an aspect of the present invention.
Figure 3B:
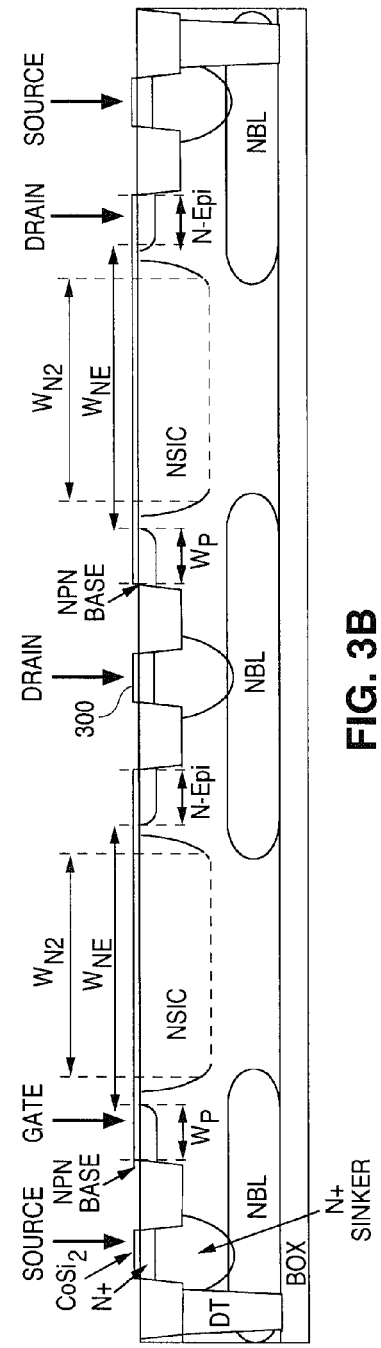
FIG. 3B is a schematic cross-section illustrating the FIG. 3A power optimized Schottky-JFET.

FIG. 3A shows a top view layout of a power optimized Schottky JFET in accordance with the concepts of this aspect of the invention, while FIG. 3B shows the corresponding cross section of the power optimized Schottky-JFET in the FIG. 3A layout. As best shown in FIG. 3B, a drain contact 300 is placed in the center composite region allowing for minimizing drain capacitance and improving breakdown characteristics. The gate Schottky contact region surrounds the drain, which effectively doubles the electrical width of the structure while maintaining minimal drain contact opening. The use of deep trench (DT) isolation with the buried oxide (BOX) allows for full dielectric isolation of the proposed structures and allows for minimizing cell size.

Figure 4:
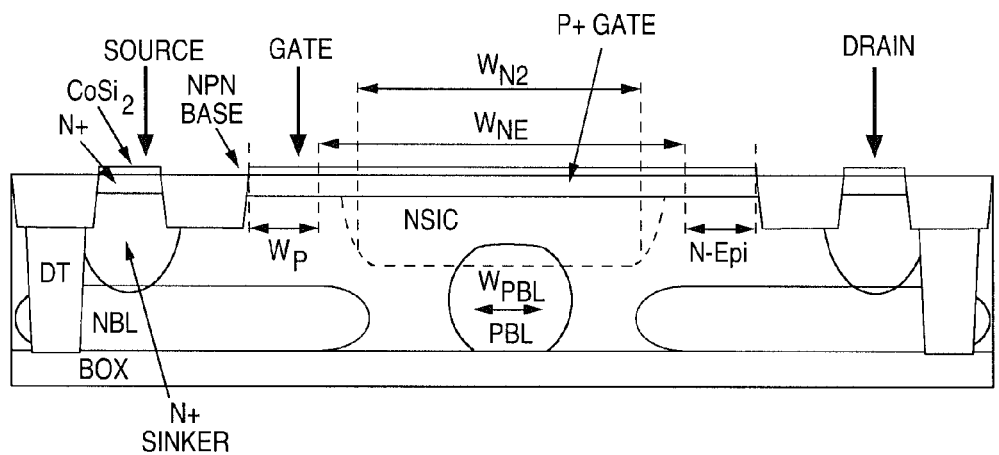
FIG. 4 is a schematic cross-section drawing illustrating an n-channel P+ gate JFET that utilizes the concepts of the invention set forth for the Schottky-JFET shown in FIGS. 1, 2, 3A/B and 4.

FIG. 4 shows the above-discussed JFET structure concept applied to the case for creating a junction isolated P+ gate N-channel JFET. The description for formation of this structure is similar to that described above for the structure show in FIG. 1, with P+ doping species implanted into and forming the gate active region. Although the P+ JFET structure shown in FIG. 4 would be expected to switch more slowly than the Schottky JFET structure in the FIG. 1 embodiment, it also has advantages for low gate leakage applications. Utilization of the same cell designed for Schottky can also achieve a more conventional diffusion JFET with lower leakage. Similarly, as will be recognized by those skilled in the art, the concepts of this aspect of the present invention can be applied to the fabrication of a P-channel JFET by switching the doping species and modifying the layout dimensions slightly to account for diffusion differences.

Figure 5:
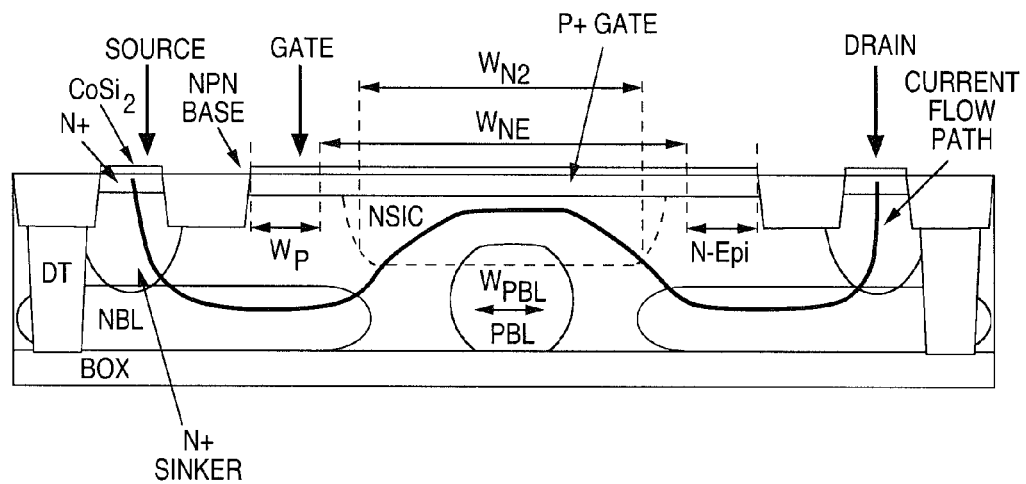
FIG. 5 is a schematic cross-section drawing illustrating the FIG. 5A n-channel P+ gate JFET an showing the current conduction path of the device.

FIG. 5 shows a schematic cross section for an N− channel P+ gate JFET as shown in FIG. 4, and also showing the current conduction path. More specifically, the dark line in FIG. 5 shows a typical path for current flow in the proposed JFET linkup structure using the NBL for linkup regions and a P-buried layer (PBL) channel stop under the active gate region. It is noted that by using asymmetry on the drain side of the linkup region, it is possible to obtain a higher voltage JFET. In this case, the N− epi region can be used as a drain-extended region to increase the breakdown characteristics of the proposed device, similar to the concepts of a drain-extended CMOS structure, but utilizing this concept for an improved high voltage JFET. It is also noted that the proposed method can also be applied to the bulk silicon case for an N− channel device if the substrate wafer is P-type (the opposite JFET); a P-channel device can be fabricated on an N− type wafer. SOI allows both N− channel and P− channel JFETs to be simultaneously manufactured. It is also noted that the conduction current path in FIG. 5 is away from the STI or oxide regions between the gate and the source contact, allowing for improved noise reduction and reliability in this device.

Figure 6A:
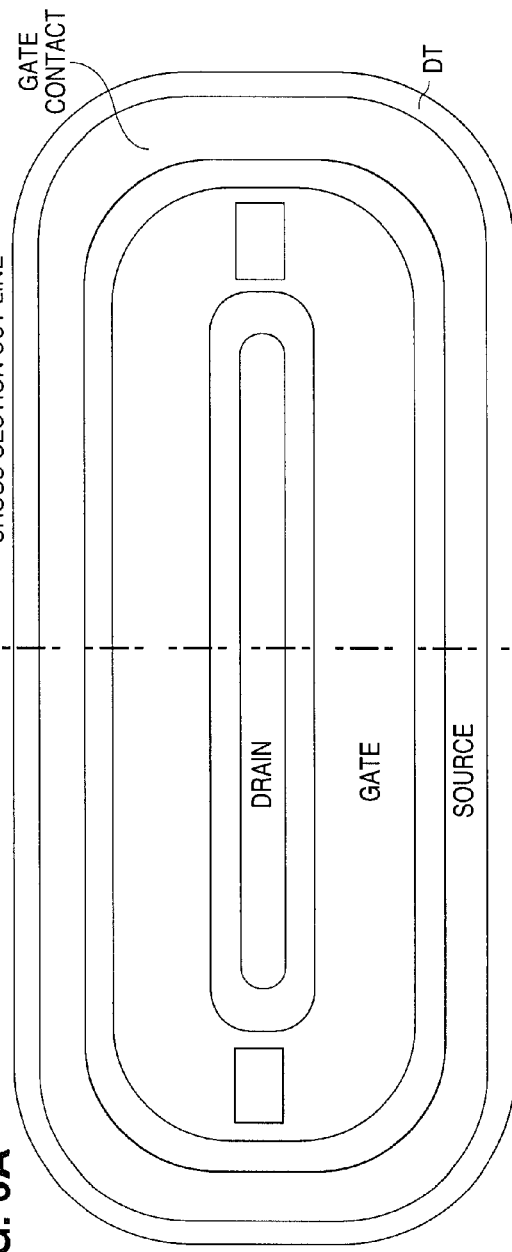
FIG. 6A is a top view layout drawing illustrating a power optimized Schottky-JFET with channel stop PBL layer in accordance with an aspect of the present invention.
Figure 6B:
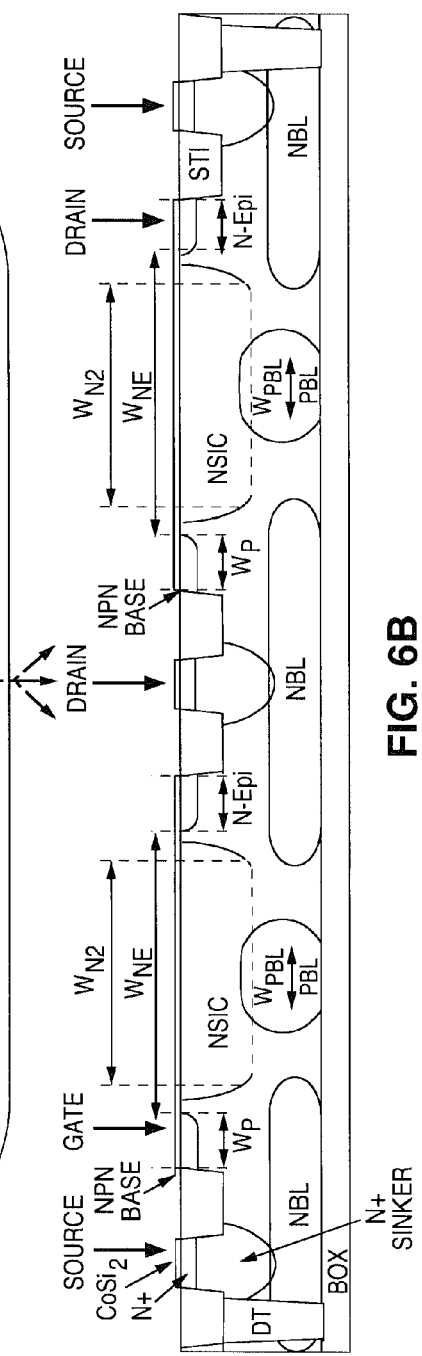
FIG. 6B is a schematic cross-section drawing taken along the cut line in FIG. 6A and illustrating the FIG. 6A power optimized Schottky-JFET.
Figure 6C:
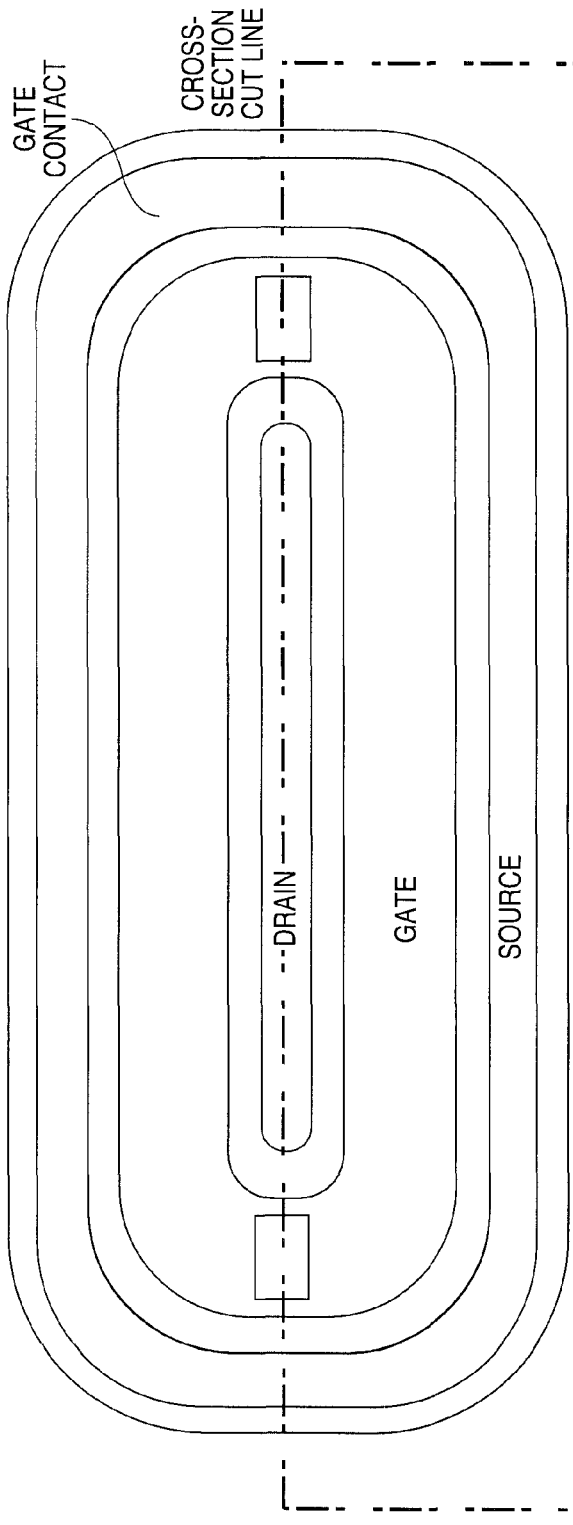
FIG. 6C is a top view layout drawing illustrating a gate contact region and sinker used to contact a PBL channel stop for a power optimized JFET in accordance with an aspect of the present invention.
Figure 6D:
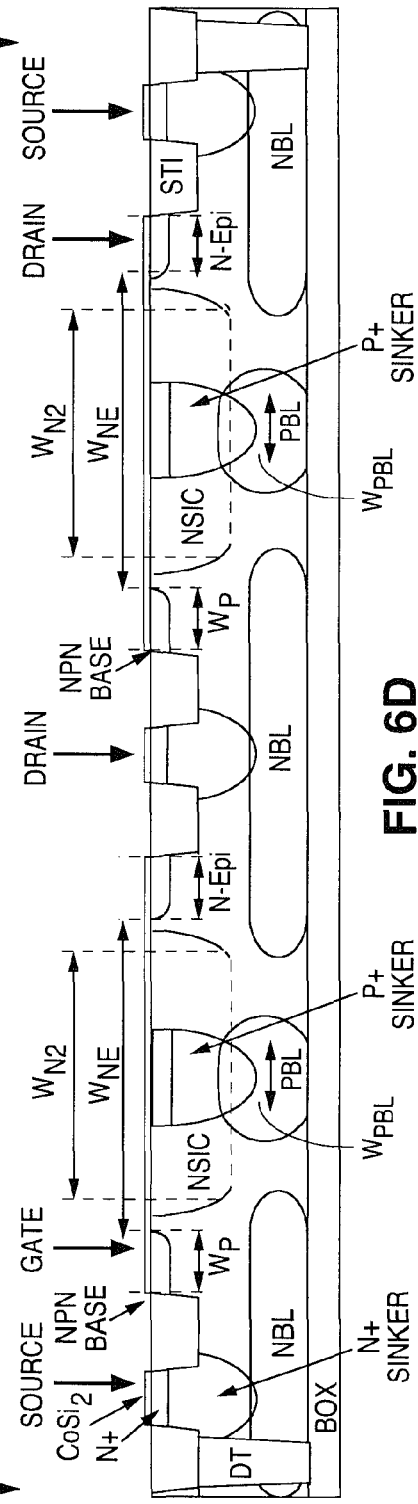
FIG. 6D is a schematic cross-section drawing taken along the cut line in FIG. 6C and illustrating the FIG. 6C power optimized JFET.

FIG. 6A shows a top view layout and FIG. 6B shows a schematic cross section, taken along the cut line in FIG. 6A, for a power optimized Schottky JFET and a schematic cross section of a JFET channel stop PBL layer. This provides a power efficient Schottky JFET layout configuration with PBL channel stop and gate contact. It should be noted that it is possible to use a sinker contact to link the top gate to the bottom gate. FIG. 6C shows a gate contact region and a sinker used to contact the PBL channel stop, while FIG. 6D shows a schematic cross section of the FIG. 6C structure, taken along the cut line in FIG. 6C, for a power optimized JFET. This second view shows the gate contact region with a sinker link to the PBL. It should be noted that the drain in FIGS. 6C-6D is not drawn to scale and, in fact, needs to be widened. Those skilled in the art will appreciate that FIG. 6C and FIG. 6D are provided only for conceptual illustration of the concepts of the present invention.

Figure 7:
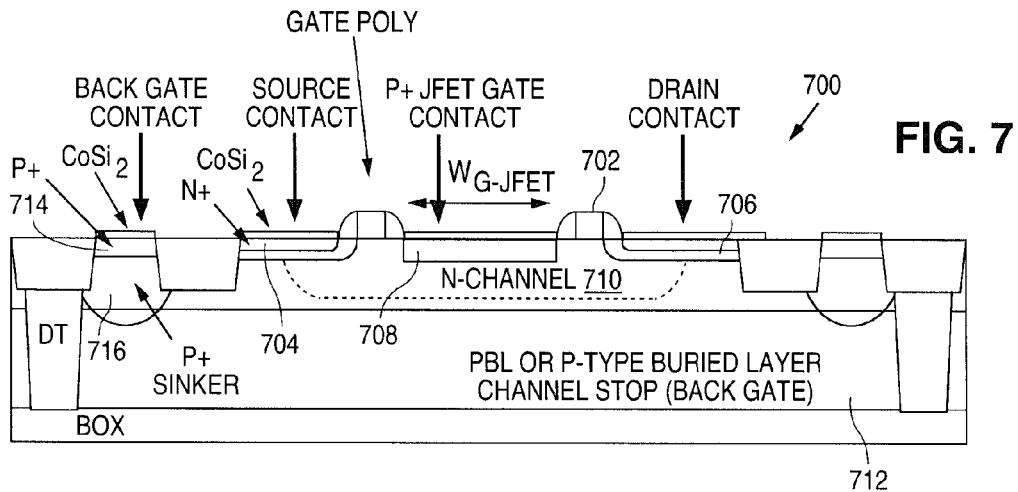
FIG. 7 is a schematic cross-section drawing illustrating an n-channel JFET with gate poly linkup in accordance with another aspect of the present invention.

In accordance with another aspect of the present invention, the gate poly, as found in a standard CMOS or BiCMOS process flow, is used to form the linkup region of a junction field effect transistor (JFET) channel region and the source/drain contact regions. FIG. 7 shows a schematic cross section of an N-JFET structure 700 with gate poly 702 forming the linkup region between the N+ source contact region 704 and the N+ drain contact region 706 in accordance with one embodiment of this aspect of the invention.

Those skilled in the art will appreciate that standard CMOS or BiCMOS processing may be used to create the N-JFET structure shown in FIG. 7. Gate poly 702 is deposited through normal CMOS processing conditions. Photoresist is used to define the gate poly linkup dimensions during the gate poly etch of the standard CMOS process flow. A P+ implant is used to define the active JFET P+ gate region 708, which can be self-aligned to the edge of the gate poly. A standard N+ implant is used to form the N+ source contact region 704 and N+ drain contact region 706 of the JFET 700, which are self-aligned to the outer edge of the gate poly 702. An N-channel implant (or an N− epi channel) 710 is utilized below the P+ JFET gate region 708 of the transistor, as shown in FIG. 7. A P− channel stop implant 712 is typically placed below the N− channel implant 710 to improve control of the electrical properties of the N-JFET 700. Those skilled in the art will appreciate that doping levels and profiles in the N− channel and the P− channel stop regions are designed or tuned to achieve JFET desired Vpinchoff vs. IDSAT and typical breakdown characteristics. Optimization of these parameters is well known to those skilled in the art of semiconductor device physics and JFET fabrication. Typical channel thicknesses are on the order of 0.2 microns, but can vary depending on the JFET design needs and desired electrical characteristics. It should be noted that partial dopant compensation of the gate poly with N+ and P+ is not expected to be a limiting factor, since the gate poly linkup is used for a lower frequency dynamic bias of the JFET.

The gate poly 702 in the FIG. 7 JFET structure 700 can be biased with voltage potentials that can allow independent control of the gate linkup structure on the source side or the drain side of the JFET. This allows one to achieve a dynamic JFET that can use gate poly bias to reduce on resistance or can be used similar to a field plate to increase breakdown voltage of the JFET. Formation of an additional accumulation layer in the poly gate linkup region reduces the on resistance Ron of the transistor. Slight depletion or full depletion of the gate poly linkup on the drain side of the transistor can result in increased breakdown capability of the JFET. The structure also acts as a bias shield that can be used to reduce the drain-to-gate capacitance of the structure, improving the Miller effect or improving the analog frequency response of the JFET. Further, depletion of the channel forces current flow away from the surface of the devices, thereby reducing the effects of surface trapping that can impact device reliability.

Although the FIG. 7 structure shows an embodiment for thick film SOI, the concepts of this aspect of the present invention are equally applicable to bulk silicon and to thin film SOI. In the case of a standard CMOS process made in bulk silicon with no deep trench, the P− substrate takes the place of the P+ buried layer in FIG. 7.

In the FIG. 7 embodiment, $CoSi_2$ is formed on both the N+ source contact region 704 and the N+ drain contact region 706, as well as on the N-channel region 708. Those skilled in the art will appreciate that any metal silicide could be utilized in this application.

FIG. 7 also shows a P+ back gate contact region 714 formed in the P-type semiconductor substrate and linked up to the P-type buried layer (PBL) 712 by a P+ sinker region 716.

Figure 8:
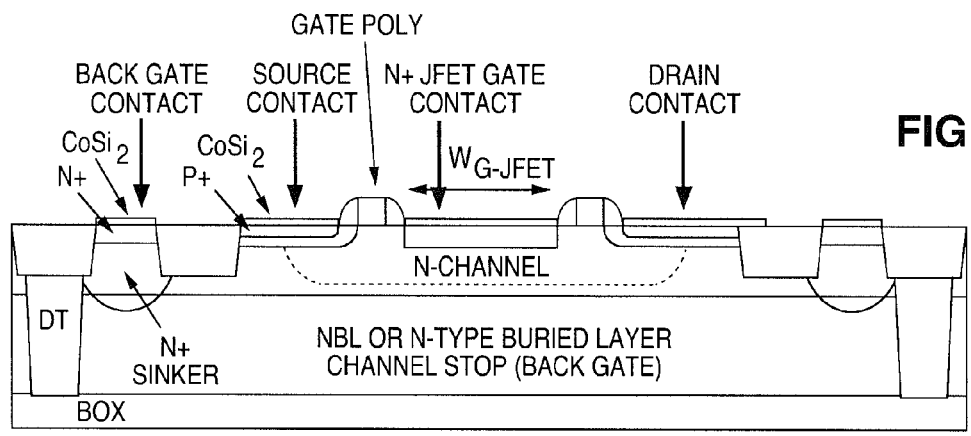
FIG. 8 is a schematic cross-section drawing illustrating a p-channel JFET with gate poly linkup in accordance with another aspect of the present invention.

FIG. 8 shows the JFET gate poly linkup structure of FIG. 7 applied to the case for creating a P− JFET. The description for formation of this structure is similar to that described for the case given in FIG. 7, with doping species changed as shown in FIG. 8. The N+ gate is formed by implant into the gate region. The gate poly linkup allows for a self-aligned JFET gate. Again, the gate poly can act as an RF shield to improve JFET performance, reducing Miller capacitance. The typical N− channel thickness is on the order of 0.2 microns, dependent upon the Vpinch and doping.

Figure 9:
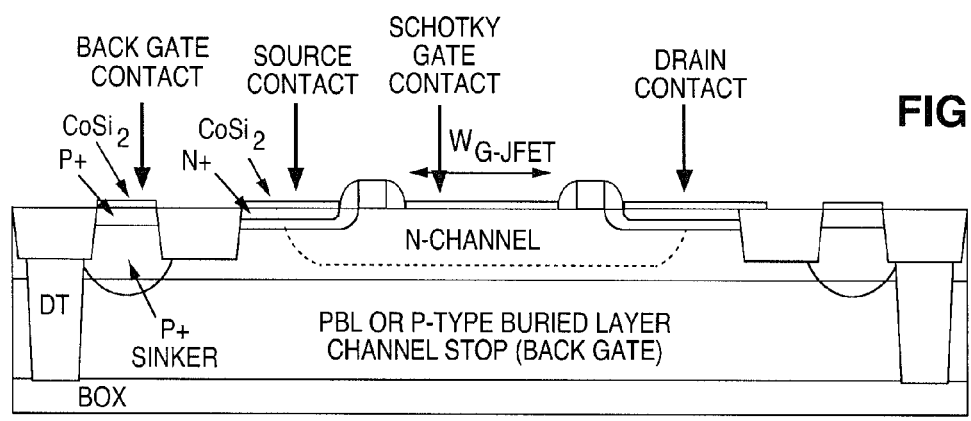
FIG. 9 is a schematic cross-section drawing illustrating an n-channel Schottky-JFET with gate poly linkup in accordance with another aspect of the present invention.

FIG. 9 shows the gate poly linkup structure applied to the condition for creating a Schottky JFET device. The JFET gate of this structure is formed as the natural Schottky barrier that forms with cobalt silicide ($CoSi_2$), or other silicide material, and the N− doped channel region below the Schottky gate contact as shown in FIG. 9. A reverse bias is applied to the Schottky gate to deplete the channel region and pinch off the transistor (turn-off condition). The Schottky JFET structure shown in FIG. 9 is self-aligned by use of the gate-linkup and has the advantage of not needing a salicide block mask for the formation of the structure.

The Schottky-JFET should have advantages of the standard JFET since the Schottky diode over the gate does not have minority carrier charges, thereby improving switching speed of the transistor. Gate leakage current is higher, but one can trade off gate leakage with improvement in speed and switching efficiency. Bias applied to the gate poly linkup can be utilized in the FIG. 9 structure similar to the descriptions given for the FIG. 7 structure.

Figure 10:
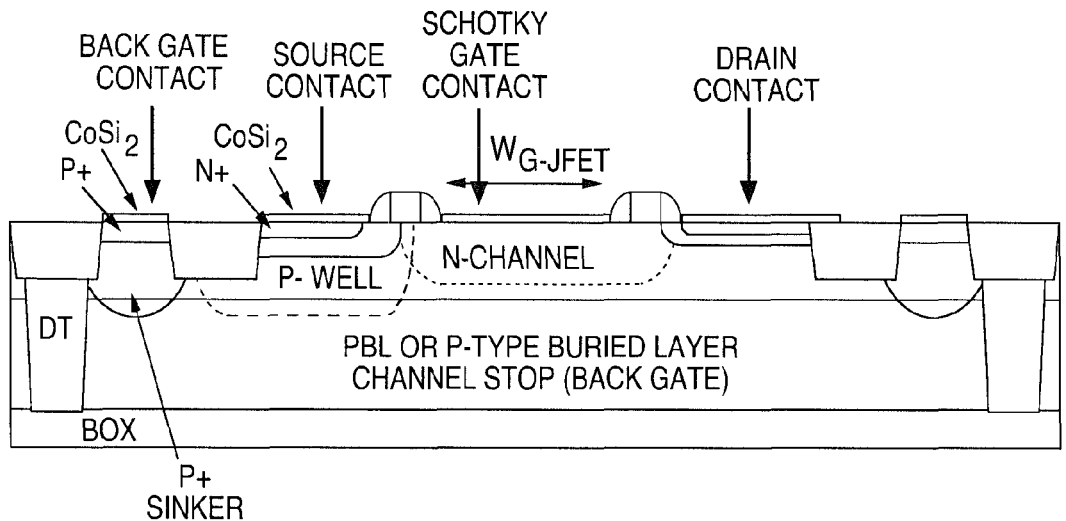
FIG. 10 is a schematic cross-section drawing illustrating an n-channel Schottky-JFET with gate poly linkup and use of a P-well or double diffuse region on the source side to form an analog JFET in accordance with another aspect of the present invention.

FIG. 10 shows a schematic cross section for an N− channel Schottky-JFET with gate poly linkup and the use of a P− well or double diffused region on the source side to form an improved analog JFET. Asymmetry is used in the FIG. 10 structure to improve source blocking voltage and to minimize drain-body capacitance and drain-to-gate capacitance. As shown in FIG. 10, the poly gate is used to block silicide from forming between the gate and the source/drain regions. Voltage to the poly gate can be used to reduce the JFET source/drain resistance. The poly gate allows for the tradeoff between maximum breakdown voltage versus lower on resistance. As stated above, cobalt silicide forms a Schottky gate for the JFET. This Schottky structure is expected to switch faster than the N+ junction isolated gate structure. As shown in FIG. 10, a P-well is added to the source side to improve channel punch through. Dynamic gate poly bias can be used to reduce source resistance. Those skilled in the art will appreciate that a similar concept can be applied to an N− JFET or a P− JFET structure using P+/N+ gates, respectively, for the JFET.

Figure 11:
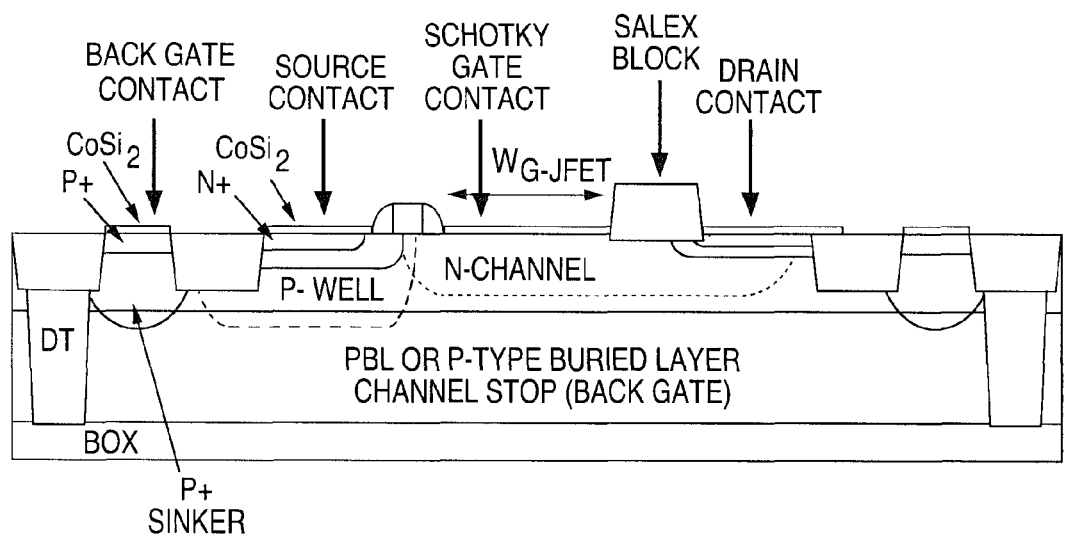
FIG. 11 is a schematic cross-section drawing illustrating an n-channel Schottky-JFET with gate poly linkup and use of a P-well or double diffuse region on the source side to form an analog JFET in accordance with another aspect of the present invention.

FIG. 11 shows a schematic cross section for a N− channel Schottky JFET with gate poly linkup and the use of a P− well or double diffused region on the source side to form an improved analog JFET. A gate poly is used on the source side; bias can be applied to reduce source resistance. A salicide block is used on the drain side to achieve higher voltage without using a gate poly or complication of gate poly bias on the drain linkup side of the JFET.

Figure 12:
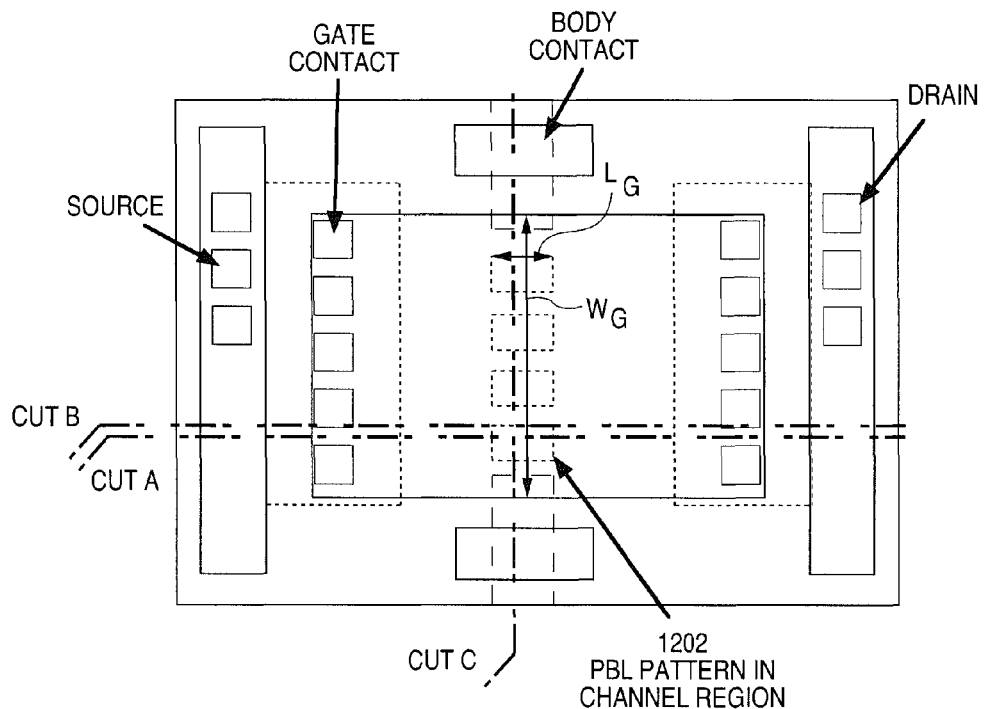
FIG. 12 is a top view layout drawing illustrating an n-channel JFET using a patterned buried layer to control channel current flow in the JFET in accordance with another aspect of the present invention.

In accordance with yet another aspect of the present invention, a patterned buried layer is used for formation of the JFET channel stop for the JFET back gate structure. FIG. 12 shows the proposed top view layout of the patterned buried layer JFET structure 1200. The patterned buried layer 1202 in the channel region is drawn with a fixed spacing between the buried layers, as shown in FIG. 12. Vertical and lateral diffusions are used to link up the bottom channel regions of the transistors as shown in FIGS. 13-15.

Figure 13:
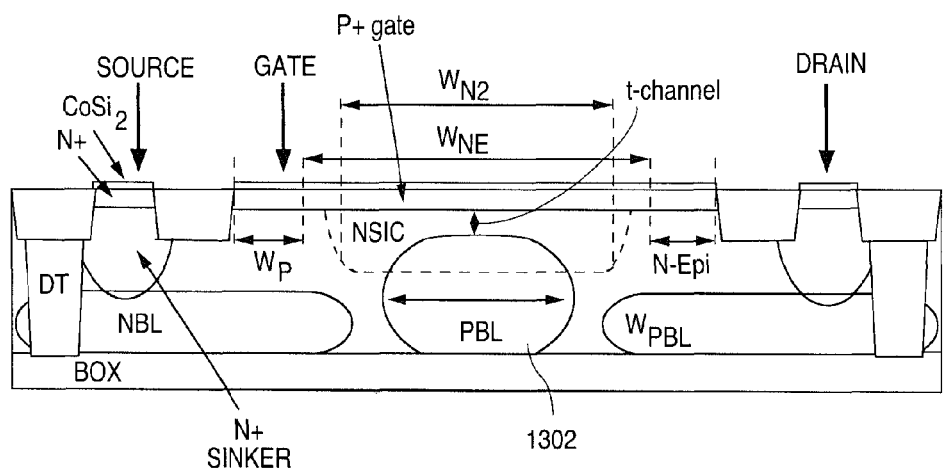
FIG. 13 is a schematic cross-section drawing illustrating the FIG. 12 n-channel JFET at cut line A shown in FIG. 12.

FIG. 13 shown and n-channel JFET structure 1300 where the cross section is taken along the cut line A shown in the top view layout inset in FIG. 13. The channel stop buried layer PBL 1302 or back gate is implanted in this case during the formation of the PBL for a CBiCMOS process. An N– epi layer is then grown. The PBL layer 1302 diffuses upwards and laterally due to thermal diffusion. Note that the cross section represents the final diffusions that would be encountered at the end of the processing of the device. The PBL up diffuses to a maximum distance due to the total thermal budget resulting in an N– channel thickness defined as $t_{channel-1}$ in FIG. 13.

Figure 14:
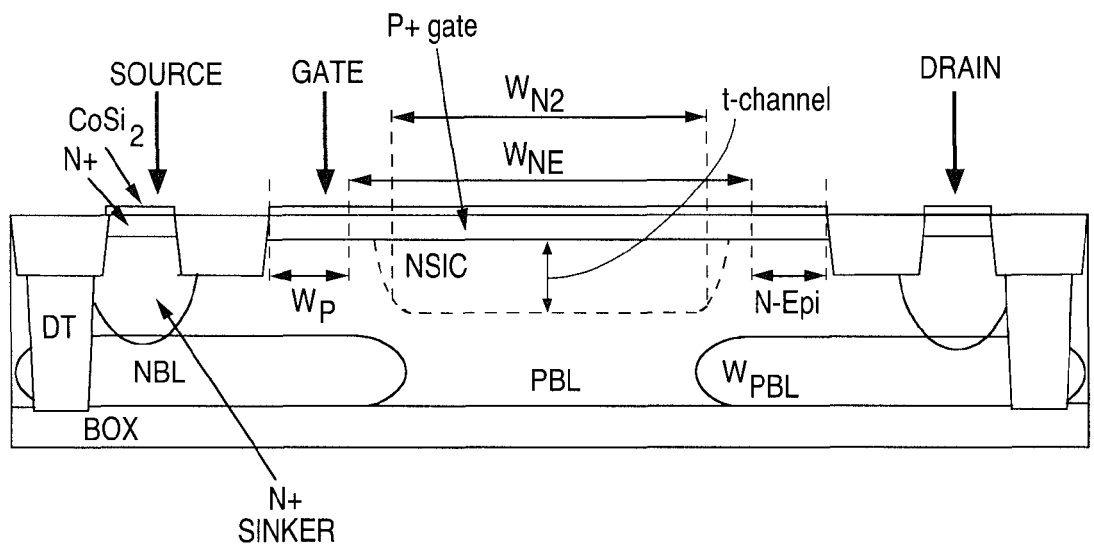
FIG. 14 is a schematic cross-section drawing illustrating the FIG. 12 n-channel JFET at cut line B shown in FIG. 12.

FIG. 14 shows the cross section taken in the cut line B of the inset top layout shown in FIG. 14. Cut line B is in the drawn pattern region between PBL regions 1302. Later, diffusion is used to connect the lateral directions of this PBL with the nearest neighbor drawn PBL regions. The drawn pattern region in this cut line B will also show up-diffusion, but to a lower level than that shown in the FIG. 13 structure. Hence, in this region, channel thickness $t_{channel-2}$ is achieved, as shown in FIG. 14.

Figure 15:
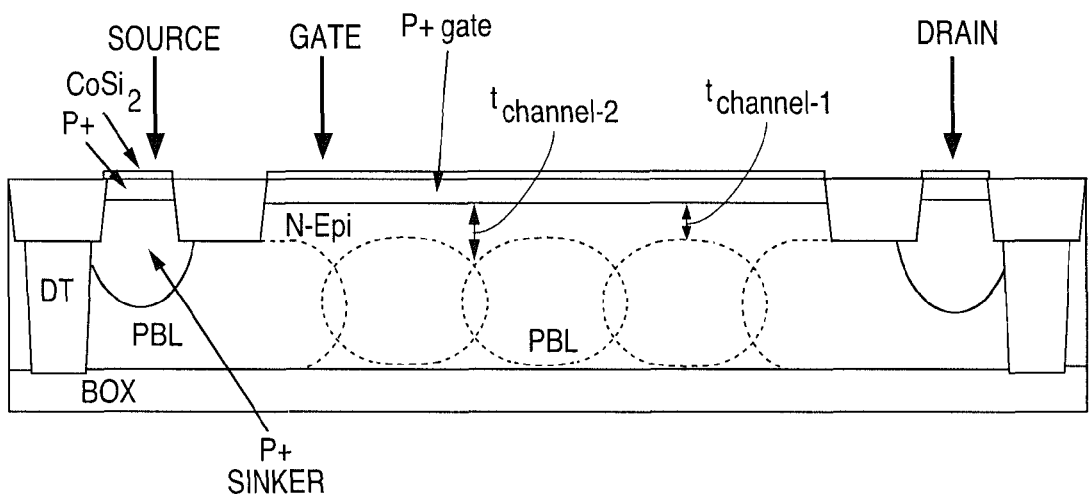
FIG. 15 is a schematic cross-section drawing illustrating the FIG. 12 n-channel JFET at cut line C shown in FIG. 12.

FIG. 15 shows a JFET cross section taken along the channel width of the transistor as shown in the inset top view layout along cut line C in FIG. 15. In FIG. 15, it can be clearly seen that the channel region will result in variable channel thickness ranging from a minimum thickness ($t_{channel-1}$) to a maximum channel thickness ($t_{channel-2}$). FIG. 15 also shows the back-gate or buried channel contact. The actual values of the patterned back gate (or channel stop) thickness to the top gate P+ region depend on the vertical and lateral diffusion of the PBL (total thermal budget encountered) and on the pattern spacing between drawn PBL regions and drawn widths of the PBL layer. By adjusting the pattern, one is able to obtain different channel stop profiles that will set different V– pinch vs. different drive current capabilities. In addition, by utilizing charge sharing principles in the structure, it is possible to achieve higher breakdown properties of the JFET structure by simply adjusting the layout pattern of the channel stop or back-gate buried layer.

Figure 16A:
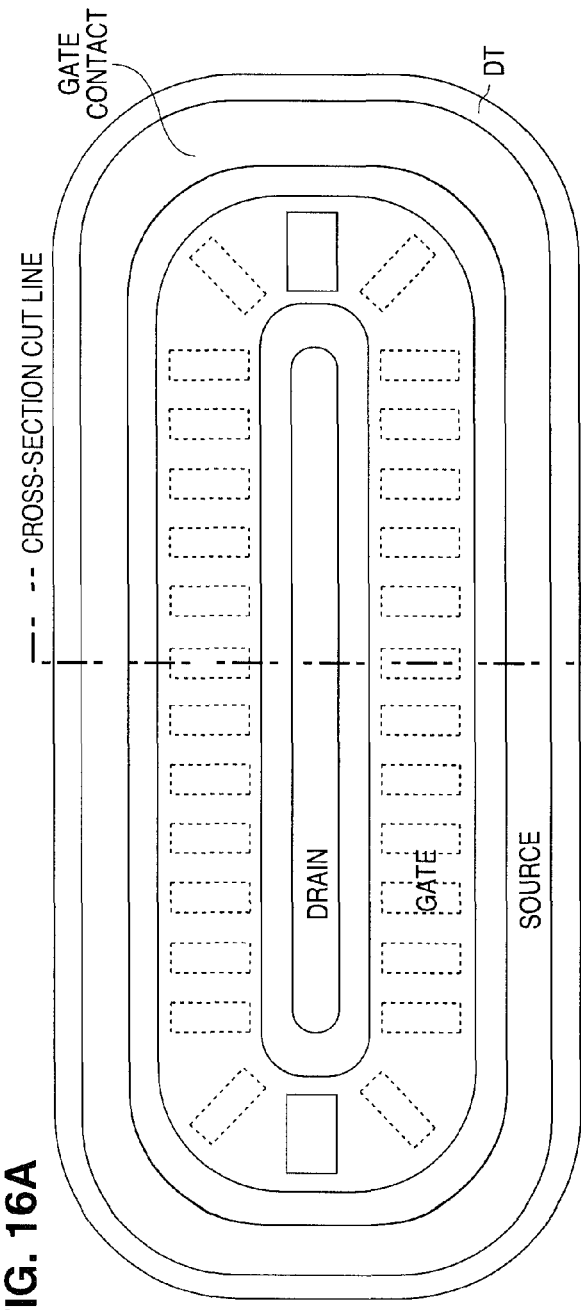
FIG. 16A is a top view layout drawing illustrating a power optimized n-channel JFET using a patterned P-buried layer for a back gate in accordance with another aspect of the present invention.
Figure 16B:
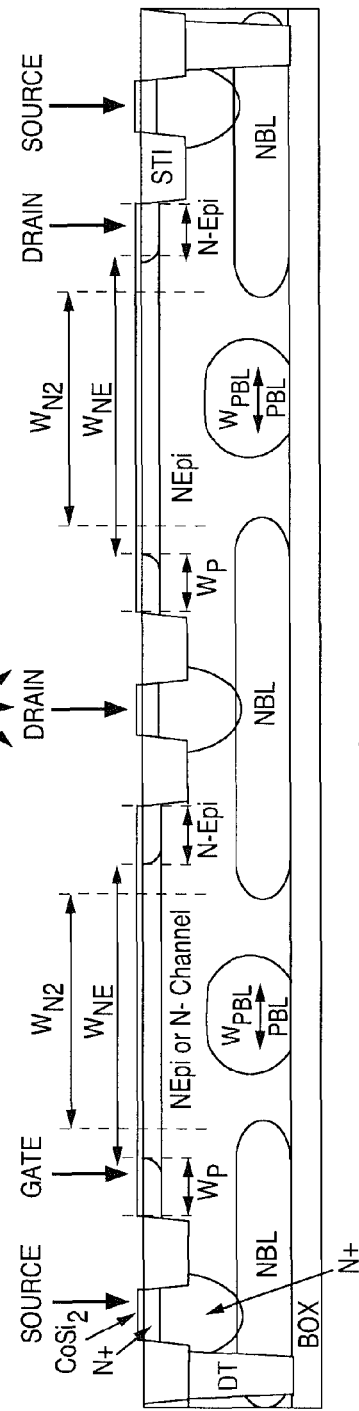
FIG. 16B is a schematic cross-section drawing illustrating the FIG. 16A power optimized n-channel JFET at the cut line shown in FIG. 16A.

FIGS. 16A-16D show the proposed patterned channel stop (back gate) applied to power optimized JFET configurations. FIGS. 16B and 16D show two cross section views taken along the cut line shown in FIGS. 16A and 16C, respectively. FIG. 16B shows the cut line in the active region of the proposed channel stop power JFET structure. FIG. 16D shows the back gate contact to the channel stop region of the proposed power JFET structure.

Figure 17A:
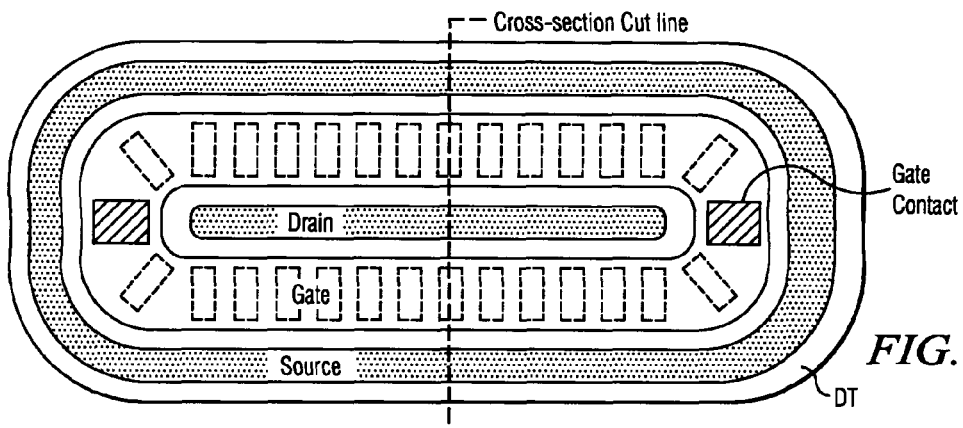
FIG. 17A is a top view layout drawing illustrating a power optimized n-channel Schottky-JFET utilizing a patterned P-buried layer for a back gate in accordance with the concepts of another aspect of the present invention.
Figure 17B:
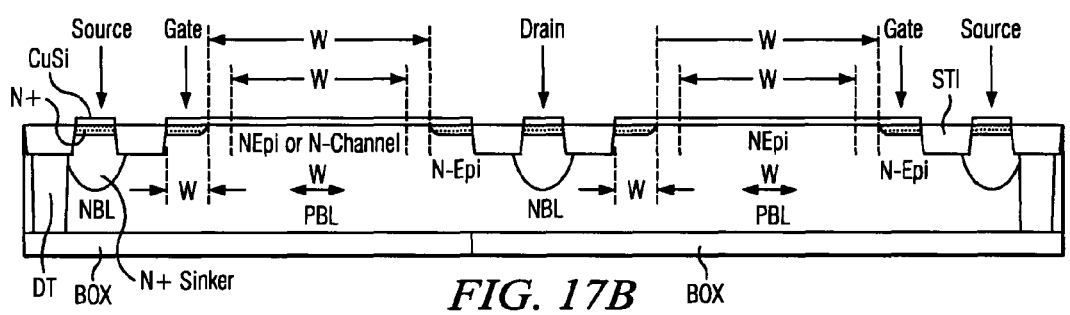
FIG. 17B is a cross-section schematic drawing illustrating the FIG. 17A power optimized n-channel Schottky-JFET at the cut line shown in FIG. 17A.
Figure 17C:
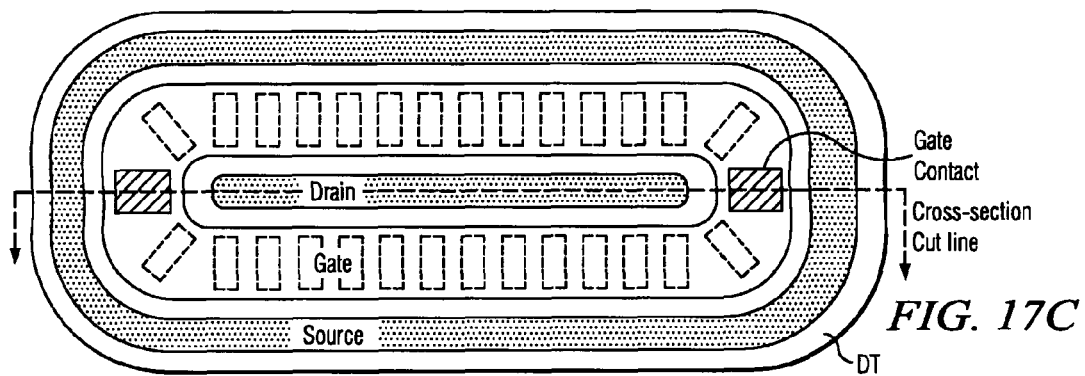
FIG. 17C is a top view layout drawing illustrating a n-channel Schottky-JFET utilizing a patterned P-buried layer for a back gate in accordance with another aspect of the present invention.
Figure 17D:
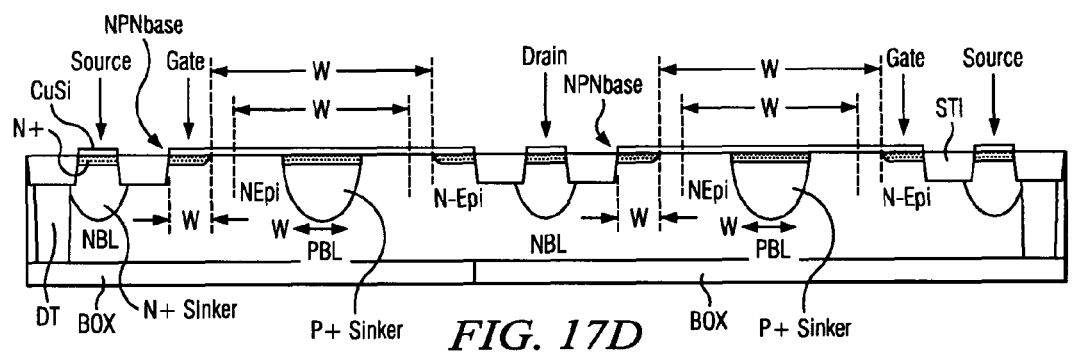
FIG. 17D is a cross-section schematic drawing illustrating the FIG. 17B power optimized n-channel Schottky-JFET at the cut line shown in FIG. 17C.

FIGS. 17A-17D show the above-discussed concepts of this aspect of the present invention for the case of creating a Schottky N– channel JFET transistor. FIGS. 17B and 17D show two cross sections taken along the cut lines shown in FIGS. 17A and 17C, respectively.

Although the methods described for this aspect of the invention are applicable to a CBiCMOS process, those skilled in the art will appreciate that the concepts can be readily applied to fabricate JFETs using these concepts, but modified appropriately for the desired JFET and semiconductor processes. Those skilled in the art will further appreciate that the concepts outlined herein for this aspect of the invention for N-channel JFET devices can be readily applied to P-channel JFET devices by changing the doping and the structure from N– to P– and from P– to N–. It is also noted that the patterned buried layer concept discussed with respect to this aspect of the invention can be leveraged and applied to the top gate structure and/or to a combination of patterned top gate and bottom gate structures for additional control of the JFET device properties for controlling V– pinch, drive current and breakdown. In addition, patterning the top and bottom gate structure into a funnel-type structure to link up the drain region of the transistors can be leverage to further improved power JFET operating parameters.

Figure 18:
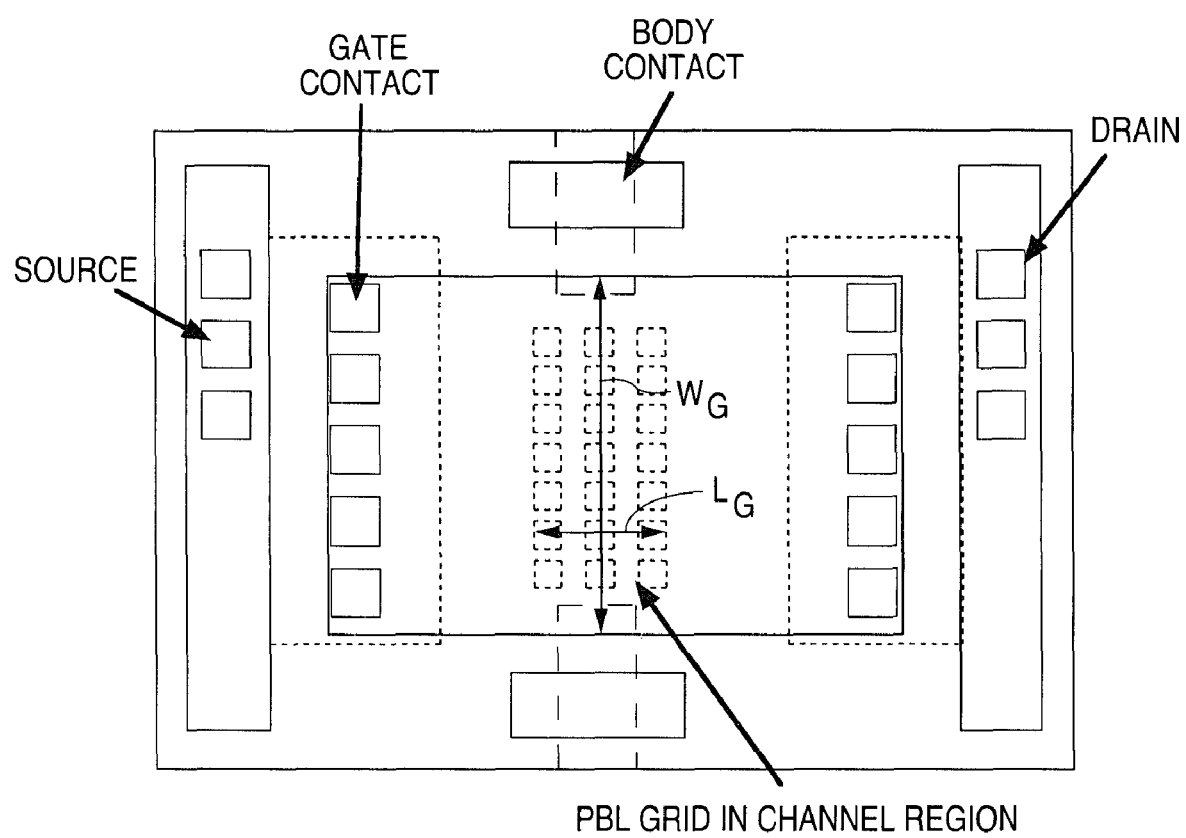
FIG. 18 is a top view layout drawing illustrating a grid pattern for a back gate channel stop in accordance with another aspect of the resent invention.

FIG. 18 shows a grid pattern for the channel stop. In this case, the diffusion properties of point sources are used to radiate out and up to form the channel stop region of the JFET. This pattern results in less total up-diffusion compared to a blanket buried layer pattern and, hence, results in an increase channel vertical thickness for the JFET, resulting in higher V– pinch and higher drive current compared to the blanket case. Adjustments of the grid layout can be used for adjusting V– pinch and ION. It is also noted that these concepts can be applied to the top gate and can be performed for both N– channel and P– channel JFET structures.

It should be recognized that a number of variations of the above-discussed aspects and embodiments of the present invention will be obvious to one of ordinary skill in the art in view of the foregoing description. Accordingly, the invention is not to be limited by those specific embodiments and methods shown and described herein. Rather, the scope of the invention is to be defined by the following claims and their equivalents.

What is claimed is:

1. A Schottky junction field effect transistor (JFET) structure formed in a semiconductor substrate, the JFET structure comprising:
   an n-channel region formed in a channel surface portion of the semiconductor substrate, the n-channel region being surrounded by shallow trench isolation dielectric material;
   a metal silicide gate formed over the n-channel region;
   p+ guard rings formed in the outer edges of the channel surface portion adjacent the shallow trench isolation dielectric material;
   an n+ source contact region formed in the semiconductor substrate and spaced-apart from the n-channel region by the shallow trench isolation dielectric material, the n+ source contact region having metal silicide formed thereon;
   an n+ drain contact region formed in the semiconductor substrate and spaced-apart from the n-channel region by the shallow trench isolation dielectric material, the n+ drain contact region having metal silicide formed thereon;
   a source contact N+ buried layer (NBL) formed beneath an upper surface of the semiconductor substrate and beneath and spaced-apart from the n+ source contact region;
   a drain contact N+ buried layer (NBL) formed beneath the upper surface of the semiconductor and beneath a spaced-apart from the n+ drain contact region;
   an n+ source sinker region formed in the semiconductor substrate to extend from the n+ source contact region to the source contact N+ buried layer; and
   an n+ drain sinker region formed in the semiconductor substrate to extend from the n+ drain contact region to the drain contact N+ buried layer.

2. The Schottky JFET structure of claim 1, and further comprising:
   a P+ buried layer formed in the semiconductor substrate beneath the n-channel region.

* * * * *